United States Patent [19]
Wakefield

[11] Patent Number: 5,362,679
[45] Date of Patent: Nov. 8, 1994

[54] PLASTIC PACKAGE WITH SOLDER GRID ARRAY

[75] Inventor: Gene F. Wakefield, Plano, Tex.

[73] Assignee: VLSI Packaging Corporation, Richardson, Tex.

[21] Appl. No.: 96,416

[22] Filed: Jul. 26, 1993

[51] Int. Cl.⁵ ............................................. H01L 21/60
[52] U.S. Cl. .................................. 437/206; 437/209; 437/214; 437/217
[58] Field of Search ............... 437/206, 207, 217, 220, 437/208, 214, 209

[56] References Cited

U.S. PATENT DOCUMENTS

| | | | |
|---|---|---|---|
| 4,264,917 | 4/1981 | Ugon | 437/217 |
| 4,452,259 | 9/1985 | Butt | 437/217 |
| 4,987,100 | 1/1991 | McBride et al. | 437/206 |
| 5,102,828 | 4/1992 | Marchisi | 437/217 |
| 5,139,969 | 8/1992 | Mori | 437/217 |
| 5,157,480 | 10/1992 | McShane et al. | |
| 5,172,214 | 12/1992 | Casto | 437/220 |
| 5,206,188 | 4/1993 | Hiroi et al. | 437/217 |

Primary Examiner—Brian E. Hearn
Assistant Examiner—Kevin M. Picardat
Attorney, Agent, or Firm—Jack A. Kanz

[57] ABSTRACT

Solderable connections are formed in a grid array pattern on the surface of a plastic package by modifying conventional lead frame assemblies so that the outer ends of the leads terminate at the bottom surface of the package and forming solder pads or balls on the ends of the leads. Conventional lead frames are used and, after modification, are encapsulated using conventional plastic packaging techniques to form plastic packages with solderable terminal ends arranged in an interconnection array on one surface of the package.

15 Claims, 2 Drawing Sheets

PLASTIC PACKAGE WITH SOLDER GRID ARRAY

This invention relates to packaging of electronic circuit device components. More particularly, it relates to packaging arrangements using conventional lead frame assemblies which are modified and then encapsulated using conventional molded plastic packaging techniques to produce packages wherein the input/output terminals of the package are distributed on the underside of the package in a solderable grid array. The packaging of the invention may include an air-filled cavity surrounding the chip to provide plastic packaging for high frequency devices and arrangements which include heat sinks for rapid conduction of thermal energy from the chip to the package exterior.

BACKGROUND OF THE INVENTION

Electronic devices generate heat in operation and, in most cases, the devices are temperature sensitive. The temperature at which the device chip operates and the ability to remove heat from the chip may, in fact, determine or limit various operating characteristics of the circuit. Thus, means is often provided for conducting heat from the package to an external sink. In simple plastic-encapsulated devices, the heat may be adequately removed by the leads. The encapsulating plastic, however, is not a particularly effective heat transfer medium. Accordingly, as the density of device functions increases, the need for effective heat dissipation increases. Where the device chip is encapsulated in the plastic, removal of thermal energy is difficult.

Advances in microelectronics technology tend to develop device chips which occupy less physical space while performing more functions. Conventionally, the chips are packaged for use in housings which protect the chip from its environment and provide means for input/output communications between the chip and external circuitry. The continuing drive toward miniaturization thus results in generation of more heat in less physical space with less structure for removing heat from the package. Similarly, the development of electronic circuit device chips using compound semiconductors further expands the requirements for packaging which can contain devices operating at higher temperatures and control device temperatures by heat dissipation.

Miniaturization of chips has also led to encapsulation of more than one chip body within a single package housing. The chips may be supported on one or both sides of a substrate or rerouting board and may even be assembled in stacked arrangements. For purposes of this disclosure, the terms "chip", "die" and "circuit device" and the like are used interchangeably and are intended to cover all electronic circuit device configurations enclosed within a single housing or package, regardless of whether such device configuration is in the form of one or more pieces of semiconductor material and/or supporting interconnection structure.

Conventionally, high pin-count packages are generally either ceramic packages or plastic packages. Ceramic packages are better heat conductors than plastics, provide hermetic sealing and are thus generally considered more reliable. However, ceramic packaging is relatively expensive. Transfer and injection molded plastic packaging is much less expensive and is therefore widely used when the advantages of hermetic sealing are not essential.

Ceramic and glass packages can provide a gas-filled or evacuated (both herein referred to as gas-filled) cavity surrounding the circuit chip because hermetic sealing of the cavity can be achieved. In most plastic packages, the chip and electrical interconnections between the chip and the lead frame are all encapsulated in the plastic material. The plastic material, however, has a higher dielectric coefficient than air, resulting in reduced frequency transmission signals through the interconnections encapsulated in plastic.

Miniaturization of the device package has also led to significant problems in mounting the package on support media such as circuit boards or the like. As package sizes decrease and the number of input/output leads increases, the size of the individual leads and the spacing between leads must be reduced, leading to difficulties in precisely and accurately positioning and securing the leads on mounting pads on the surface of the circuit board. Such miniaturized leads are also extremely fragile, thus requiring means for protecting the package leads during fabrication, testing, transport and assembly on the board.

In an attempt to increase the number of input/output leads without reducing physical spacing therebetween, packages have been developed in which the leads project from one face of the package in an interconnection array. Typically, packages using this arrangement have a number of pins extending in an interconnection array pattern from the lower surface and are referred to as pin grid array (PGA) packages. Such packages have the distinct advantage of using the surface area of the circuit board immediately below the package for interconnections, thus permitting higher package density on the board, but are usually made using ceramic packaging techniques. Although quite effective as a mounting technique, PGA packages are usually quite expensive and must be mounted on a socket or other means to adapt the PGA to the circuit board such as by forming a grid pattern of mounting holes in the circuit board.

More direct mounting to the surface of a circuit board can be accomplished by replacing the pins of a PGA with solderable mounting pads or lands arranged on the lower surface of the package. Such land grid array or solderable grid array (SGA) packages can be more easily attached directly to appropriately arranged mounting pads on the surface of a circuit board or the like. Direct surface mounting using SGA packaging techniques not only eliminates use of fragile and flexible interconnection leads, it dramatically reduces total lead length from chip to interconnection; reduces overall package size; eliminates need for in-transit lead protection such as the commonly-used lead bumpers on quad flatpack packages; permits interconnection grid array patterns with more space between interconnection points; and generally provides easier and more reliable surface mount interconnections. Unfortunately, such SGA packages are typically ceramic packages and thus quite expensive.

More recently, plastic packaging techniques have been employed to produce an encapsulation package in which the chip is mounted on one side of a miniature circuit board with interconnection leads routed through the miniature board and terminating in an interconnection array of lands or the like on the bottom of the miniature board. Solder balls are formed on the lands or ends of the leads and the device is encapsulated in plastic on the opposite side of the miniature circuit board. This package is usually referred to as a solder ball grid array (SBGA) package and provides many of the size and interconnection advantages of SGA packages at lower costs. The typical SBGA package, however, is a composite of encapsulation materials and circuit board technology and thus is difficult to form; does not provide adequate sealing and chip protection; and is somewhat limited in applicability.

Attempts to provide bottom surface input/output terminals in molded plastic packages (such as disclosed in U.S. Pat. No. 5,157,480 to McShane, et al.) have generally been limited to providing duplicate terminal arrangements for testing and mounting and therefore require uniquely designed and fabricated lead frame assemblies and molding techniques. Such arrangements are of little utility in commercial devices and, because of their unique requirements, provide none of the desired advantages.

In accordance with the present invention, conventional lead frame assemblies and conventional plastic packaging techniques are utilized to form plastic packages with input/output terminals terminating in a solder grid array or solder ball grid array on the bottom surface of the package. Since conventional lead frame assemblies are used, the assembly process steps for mounting a die on the die pad, etc., may be identical to conventional processing. The lead frame is modified by trimming prior to encapsulation to shorten the input/output leads and arrange their outer ends in an interconnection array pattern parallel and substantially coplanar with or extending slightly lower than the bottom surface of the package to be formed. The modified lead frame assembly is then encapsulated using conventional techniques to form a plastic package with input/output terminals arranged in an interconnection array on its lower surface. By modifying conventional lead frame assemblies and using conventional assembly and plastic packaging techniques, the package of the invention can be formed effectively as inexpensively as standard plastic packages yet provide all the advantages of SGA or SBGA packages. The invention may also be used to form packages with air-filled cavities for high frequency electronic circuit devices and heat sinks for devices which generate excessive amounts of heat. Other features and advantages of the invention will become more readily understood from the following detailed description taken in connection with the appended claims and attached drawing in which:

DESCRIPTION OF THE PREFERRED EMBODIMENTS

Figure 1:
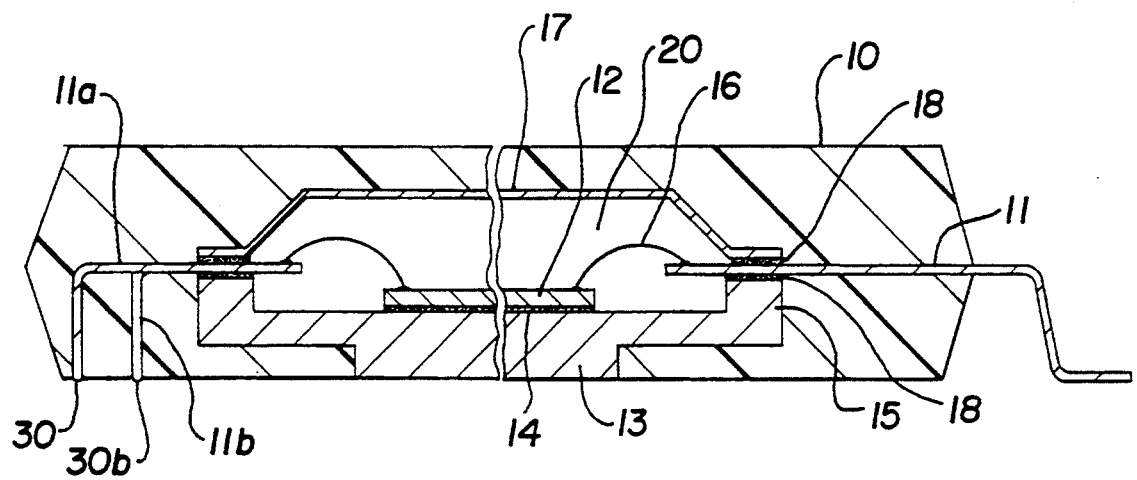
FIG. 1 is a sectional view of an encapsulation package illustrating a preferred embodiment of the invention in the left-hand side of the drawing and a conventional gullwing lead arrangement on the right-hand side of the drawing.

As illustrated in FIG. 1 the principles of the invention can be used in connection with any conventional molded plastic package using conventional lead frame assemblies. The right-hand side of FIG. 1 illustrates a plastic package 10 employing a standard lead frame with input/output leads 11. In this particular arrangement the chip 12 is bonded to a cup-like heat sink 13 with a thermally conductive material 14 and the edges 15 of the heat sink 13 secured to the leads 11 with an electrically insulating material 18. After the inner end portions of the leads 11 are appropriately electrically connected to the bond pads on the chip 12 with connecting wires 16, a cap 17 having peripheral dimensions substantially corresponding with the edges 15 of heat sink 13 is bonded to the opposite side of leads 11 and the edge of heat sink 13 with insulating material 18 to form an air-filled cavity 20 surrounding the chip 12, the wire leads 16 and the interior ends of leads 11. The cap 17 may be a metal cap, a plastic cap or any of other various apparatus for cooperating with the heat sink 13 to form an air-filled cavity 20. Such arrangements are disclosed in co-pending application for U.S. patent Ser. No. 07/922,041 filed Jul. 22, 1992, which is incorporated herein by reference for disclosure purposes.

In the embodiment illustrated in FIG. 1, the heat sink 13 extends to and forms part of the lower surface of the package 10. It will be understood, however, that the arrangement illustrated is exemplary only. The heat sink may be arranged to extend toward the upper surface and may have various different configurations without departing from the invention.

Figure 3:
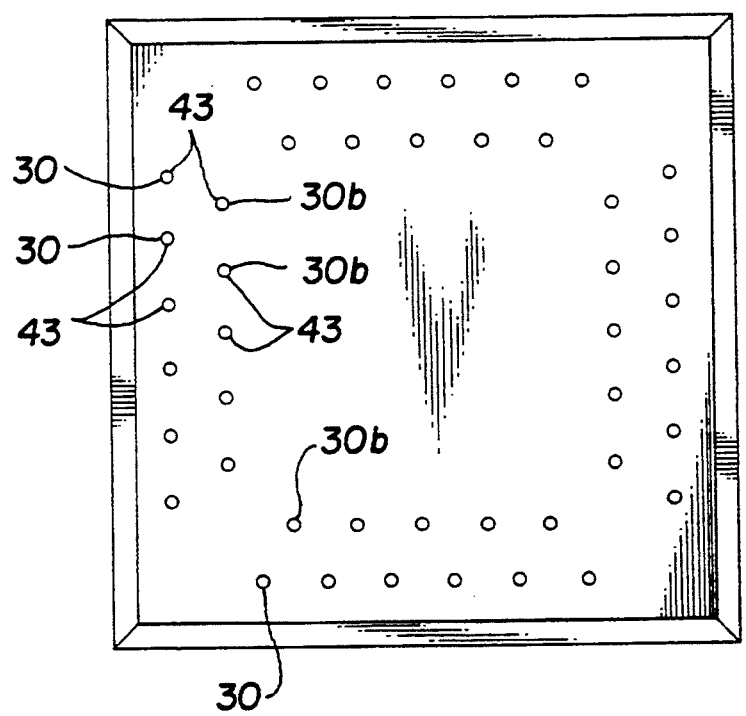
FIG. 3 is a bottom plan view of an encapsulation package made in accordance with the invention.

In conventional plastic encapsulation processes, the lead frame assembly as described above is encapsulated in plastic and the outer ends of leads 11 extending from the plastic package severed from the carrier frame and formed into input/output leads such as the conventional gullwing leads shown at the right-hand side of FIG. 1. In accordance with the present invention, however, the inner portions of leads 11 are interconnected and thus stabilized to maintain the leads 11 in position with respect to each other by attachment to the heat sink 13 and/or cap 17. The outer ends of leads 11 are severed from the carrier frame and formed into their final shape prior to encapsulation. As illustrated in the left-hand side of FIG. 1, lead 11a is bent approximately 90° at a point which is inside the package envelope and cut to a length so that its outer end 30 terminates at approximately the lower surface of the package envelope. Adjacent lead 11b is likewise bent (at a point further inside the package envelope) and cut to a length so that its outer end 30b terminates at approximately the lower surface of the package body. By varying the horizontal lengths of alternate leads, the lead ends 30 and 30b are aligned in parallel rows at the bottom surface of the package as illustrated in FIG. 3 and terminate in a plane which is substantially parallel with the bottom surface. When the lead frame assembly is encapsulated in plastic, the outer ends 30 and 30b of the leads 11a and 11b terminate at or near the lower surface of the plastic package. It should be noted, however, that by forming the ends in staggered locations to define two rows the lateral distance separating the ends of the leads is doubled. If staggered to form three rows, the distance is tripled. Thus the spacing between bonding pads on the surface of the circuit board or the like to which the package is to be attached is increased and the ends of the leads are held rigidly in fixed positions by the plastic body. The ends of the input/output leads may thus be arranged in any desired interconnection array.

In the embodiment of FIG. 1, the inner portions of the leads 11 are secured to the edge of the heat sink 13. Thus, the lead frame assembly and the arrangement of leads 11 are supported and stabilized by the heat sink 13.

The carrier frame which ordinarily supports the leads during encapsulation may be removed and the ends of the lead arranged as desired before encapsulation.

Figure 2:
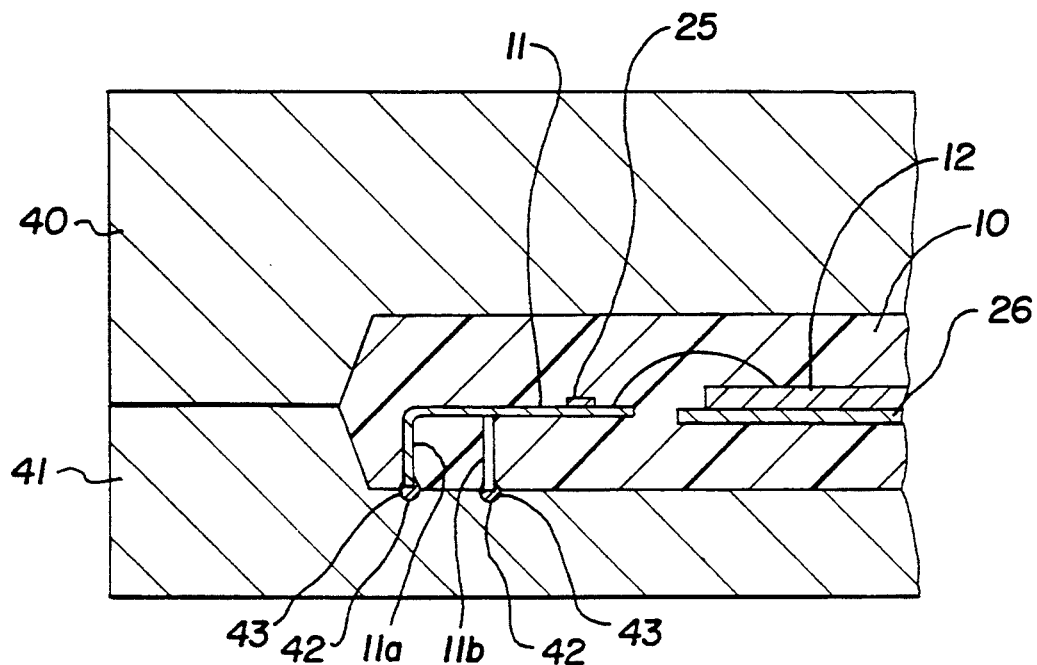
FIG. 2 is a fragmentary sectional view of an injection or transfer mold illustrating the preferred method of making encapsulation packages in accordance with the invention.

In order to make electrical contact between the ends of the leads and contact pads on the surface of a circuit board or the like, the ends 30 and 30b may be cleaned and exposed by polishing or otherwise cleaning the lower face of the package and then dipping the package in solder so that solder attaches to and accumulates on the exposed ends of the leads. Alternatively, solder may be formed on the ends of the leads by other conventional techniques, either in manufacturing of the lead frame assembly or at any time prior to molding.

one method of forming solder balls or buttons on the ends of the leads is illustrated in FIG. 2. This embodiment illustrates a more conventional plastic package which does not include the air-filled cavity of FIG. 1. Instead, the inner ends of leads 11 are interconnected and stabilized by an insulating material such as polyimide strip 25 or the like and the chip attached to a chip pad in conventional manner. The interior ends of leads 11 are also electrically connected to pads on chip 12 by wires 16 or the like in conventional manner. However, before the lead frame assembly is encapsulated (either after the chip is attached or before) the outer ends of the leads 11 are severed from the carrier frame and bent as described above and pre-tinned. Since this package does not include the heat sink 13, the polyimide strip is used to stabilize the leads so that the carrier frame can be removed. For purposes of this invention, "pre-tinned" simply means coating the lower portions of the leads with a solder-promoting material such as tin, a lead-tin alloy or other material which will reflow when heated and form or produce a good electrical and physical bond between the ends of the leads and interconnection pads or the like on the surface of a circuit board or other support medium.

In the embodiment illustrated in FIG. 2 the lead frame assembly with pre-tinned leads 11a, 11b is inserted into the cavity of a mold comprised of an upper mold 40 and lower mold 41 which, when fitted together, form a cavity corresponding to the size and shape of the plastic package to be formed. The lower mold 41 has a series of depressions 42 aligned in register with the ends of leads 11a, 11b, etc. When the lead frame assembly is positioned within the cavity of the mold and plastic injected to form body 10, the temperature of the plastic is typically 175° C. or higher. At this temperature the pre-tinned coating on the leads begins to reflow and forms a solder button 43 on the end of each lead 11 defined by the size and shape of the containing depressions 42. The solder buttons 43 will, of course, solidify as the mold is cooled and the liquid plastic fills any space formed by migration of the solder. However, the ends of the leads 11 remain thoroughly coated with the solder and electrically connected to the buttons 43. Accordingly, the package is ready for surface mounting by simply aligning the buttons 43 with mounting pads on a circuit board or the like.

It will be readily recognized that the outer ends of the leads may be pre-tinned with any suitable material to form solderable buttons lying substantially in or parallel with the surface of the package to be formed. Likewise, the solder or other material used to form solder balls or solder pads in communication with the ends of the leads (where the leads are not pre-tinned) may be any suitable solder-promoting material. The size, shape, etc., of the solder pads or balls will be determined of course, by their method of formation. Various methods such as evaporation through masks, flow-soldering, etc., may be used. Alternatively, the ends of the leads may be coated or extended with a relatively low temperature melting wax or other material which forms and occupies the desired space adjacent the ends of the leads. This material may then be removed by melting, dissolution or the like and replaced by suitable interconnection material such as solder or the like.

Since the invention utilizes conventional lead frames (modified as required) and conventional plastic packaging technologies, it may be used to form solderable grid array interconnections on a surface of virtually any standard plastic package design employing standard lead frame assemblies. Although the invention has been described with particular reference to specific embodiments thereof, it is to be understood that the invention is not so limited. The forms of the invention shown and described in detail are to be taken as preferred embodiments. Various changes and modifications may be resorted to without departing from the spirit and scope of the invention as defined by the appended claims.

What is claimed:

1. The method of forming an encapsulation package for an electronic device chip comprising the steps of:
    (a) forming the outer portions of input/output leads in a lead frame assembly having inner lead portions and outer lead portions so that the outer ends of said leads terminate in and define a plane substantially parallel with one major face of a plastic package to be formed thereabout;
    (b) securing the inner portions of said leads to stabilize and maintain their positions with respect to each other and the package to be formed hereabout; and
    (c) forming a molded plastic package about the lead frame assembly having first and second oppositely disposed major faces with the first major face substantially parallel with the plane defined by the outer ends of said input/output leads.

2. The method set forth in claim 1 including the step of attaching the inner lead portions of the input/output leads to a heat sink.

3. The method set forth in claim 2 including the step of attaching a cap to said inner lead portions and said heat sink to cooperate with said heat sink and define an air-filled cavity within the encapsulation package.

4. The method set forth in claim 1 including the step of attaching opposed caps to the inner lead portions of the input/output leads to form an air-filled cavity within the encapsulation package.

5. The method set forth in claim 1 including the step of pre-tinning the outer ends of the input/output leads before forming the plastic package.

6. The method set forth in claim 5 including the steps of:
    (a) forming depressions in the interior surface of the lower mold used to form the plastic package; and
    (b) aligning the pre-tinned ends of the leads with said depressions so that pre-tinning material flows into said depressions during formation of the plastic package.

7. The method set forth in claim 1 wherein the plane defined by the outer ends of said leads is substantially coplanar with said first major face.

8. The method set forth in claim 1 including the step of interconnecting the inner lead portions with an insulating strip.

9. The method set forth in claim 1 wherein said outer ends of said leads terminate in at least two parallel rows.

10. The method of forming an encapsulation package for an electronic device chip comprising the steps of:
  (a) interconnecting inner portions of the input/output leads of a lead frame assembly to stabilize and maintain the positions of said input/output leads with respect to each other;
  (b) forming the outer portion of at least some of said input/output leads to terminate in and define a plane substantially parallel with one major face of a plastic package to be formed thereabout; and
  (c) forming a molded plastic package about the lead frame assembly having first and second oppositely disposed major faces with the first major face substantially parallel with the plane defined by the outer ends of said input/output leads.

11. The method set forth in claim 10 wherein the inner portions of said input/output leads are connected by a polyimide strip.

12. The method set forth in claim 10 including the step of removing part of the outer portion of at least some of said input/output leads.

13. The method set forth in claim 10 wherein said inner portions are connected to a heat sink.

14. The method set forth in claim 10 wherein said inner potions are secured between opposing members which define a cavity enclosing the inner portions of said input/output leads.

15. The method set forth in claim 10 wherein the outer end portions of said input/output leads are formed to terminate in at least two parallel rows extending substantially parallel with said first major face.

* * * * *

UNITED STATES PATENT AND TRADEMARK OFFICE
CERTIFICATE OF CORRECTION

PATENT NO. : 5,362,679

DATED : November 8, 1994

INVENTOR(S) : Gene F. Wakefield

It is certified that error appears in the above-identified patent and that said Letters Patent is hereby corrected as shown below:

Column 5, line 14, change "one" to —One—

Signed and Sealed this

Twenty-first Day of February, 1995

Attest:

BRUCE LEHMAN

Attesting Officer

Commissioner of Patents and Trademarks